(12) United States Patent
Shi et al.

(10) Patent No.: US 12,133,447 B2
(45) Date of Patent: Oct. 29, 2024

(54) COLOR FILM BASE PLATE AND PREPARATION METHOD THEREFOR, AND DISPLAY DEVICE

(71) Applicant: GUANGDONG JUHUA PRINTED DISPLAY TECHNOLOGY CO., LTD., Guangdong (CN)

(72) Inventors: Wen Shi, Guangdong (CN); Yawen Chen, Guangdong (CN)

(73) Assignee: GUANGDONG JUHUA PRINTED DISPLAY TECHNOLOGY CO., LTD., Guangdong (CN)

(*) Notice: Subject to any disclaimer, the term of this patent is extended or adjusted under 35 U.S.C. 154(b) by 792 days.

(21) Appl. No.: 17/290,498

(22) PCT Filed: Nov. 6, 2019

(86) PCT No.: PCT/CN2019/116033
§ 371 (c)(1),
(2) Date: Nov. 12, 2021

(87) PCT Pub. No.: WO2020/094068
PCT Pub. Date: May 14, 2020

(65) Prior Publication Data
US 2023/0247893 A1    Aug. 3, 2023

(30) Foreign Application Priority Data
Nov. 6, 2018   (CN) .......................... 201811312489.0

(51) Int. Cl.
*H01L 29/08*   (2006.01)
*H10K 59/35*   (2023.01)
*H10K 59/80*   (2023.01)
*G02B 5/20*    (2006.01)
*H10K 59/12*   (2023.01)

(52) U.S. Cl.
CPC ......... *H10K 59/8792* (2023.02); *H10K 59/35* (2023.02); *G02B 5/20* (2013.01); *H10K 59/12* (2023.02)

(58) Field of Classification Search
CPC ....... H01L 25/167; H01L 33/50; H01L 33/18; H01L 33/10; H01L 33/46; H01L 33/20;
(Continued)

(56) References Cited

U.S. PATENT DOCUMENTS

2007/0153175 A1   7/2007   Chang et al.
2013/0320842 A1   12/2013  Park et al.
(Continued)

FOREIGN PATENT DOCUMENTS

CN   104009062 A   8/2014
CN   104880879 A   9/2015
(Continued)

OTHER PUBLICATIONS

International Search Report and Written Opinion from International Application No. PCT/CN2019/116033 mailed Feb. 14, 2020.

*Primary Examiner* — Niki H Nguyen
(74) *Attorney, Agent, or Firm* — Dorsey & Whitney LLP

(57) ABSTRACT

A color film base plate, comprising a color film substrate, multiple black matrices positioned on the color film substrate, and a color film layer; the color film layer being disposed between two adjacent black matrices; the color film layer including a color resist material and light scattering particles. The described color film substrate may improve a viewing angle of a display device, further improving display effect of a display.

19 Claims, 3 Drawing Sheets

(58) Field of Classification Search
CPC ....... H01L 2924/12041; H01L 27/1214; H01L 33/60; H01L 2933/0091; H01L 33/502; H01L 31/125; H01L 33/504; H01L 27/14625; H01L 27/153; H10K 59/12; H10K 50/00; H10K 59/877; H10K 50/854; H10K 59/38; H10K 50/865; H10K 50/11; H10K 50/852; H10K 50/86; H10K 59/35; H10K 77/10; H10K 50/19; H10K 59/876; H10K 59/8791; H10K 30/87; H10K 50/115; H10K 59/8792; H10K 2102/331; H10K 50/856; H10K 59/878; H10K 59/122; G02B 5/20

See application file for complete search history.

(56) References Cited

U.S. PATENT DOCUMENTS

2014/0160408 A1* 6/2014 Cho ................. G02F 1/133617
349/110
2017/0123317 A1* 5/2017 Kamura ................. H01L 31/055

FOREIGN PATENT DOCUMENTS

| CN | 105161513 A | 12/2015 |
| CN | 205787482 U | 12/2016 |
| CN | 107515488 A | 12/2017 |
| CN | 108303820 A | 7/2018 |
| CN | 108363238 A | 8/2018 |

* cited by examiner

COLOR FILM BASE PLATE AND PREPARATION METHOD THEREFOR, AND DISPLAY DEVICE

CROSS REFERENCES TO RELATED APPLICATIONS

This application is a U.S. National Stage of PCT International Application No. PCT/CN2019/116033 filed on Nov. 6, 2019, which claims priority to Chinese Patent Application No. 201811312489.0, titled "Color filter base plate and method for preparing the same, and display device and method for preparing the same", filed on Nov. 6, 2018, the disclosure of each of which is incorporated in its entirety herein by reference.

TECHNICAL FIELD

The present disclosure relates to the field of organic electroluminescence display, in particular to a color filter base plate and a method for preparing the same, and a display device and a method for preparing the same.

BACKGROUND

Organic electroluminescent diode (OLED) which has the advantages of self-luminescence, fast response, wide viewing angle, high brightness, lightness and thinness, and quantum dot light emitting diode (QLED) which has the advantages of high color purity of light, high luminous quantum efficiency, easy adjustment for emission color, and long service life, are the two main directions of current research on display devices.

The OLED has an anode, an organic light-emitting material layer, and a cathode sequentially formed on a substrate. In the direction of application of large-size OLED displays, a bottom emission structure is adopted for most of the products on the market adopt, and a thicker metal layer is adopted for the cathode of the OLED. In an OLED display panel having this structure, the light emitted by the organic light-emitting material layer is required to penetrate the planarization (PLN) layer and the thin film transistor (TFT) layer below it, which reduces the luminous efficiency. Thus, with the increase in resolution, bottom emission OLEDs will be limited by the aperture ratio, making it difficult to achieve high resolution. More and more practitioners are turning their attention to the development of top emission OLEDs to improve the luminous efficiency and achieve high-resolution displays.

However, in a top emission OLED device, a semi-transparent Mg:Ag alloy is usually used as a cathode, which has a relatively obvious microcavity effect, resulting in a poor viewing angle.

SUMMARY

Accordingly, the present disclosure provides a color filter base plate, which can increase the viewing angle of a display device and improve the display effect of a display.

The technical solution is as follows:

A color filter base plate comprises a color filter substrate, a plurality of black matrices positioned on the color filter substrate, and a color filter layer; the color filter layer being disposed between two adjacent black matrices;

the color filter layer comprising a color resist material and light scattering particles.

In one of the embodiments, the color filter layer comprises a light scattering film and a color resist layer that are stacked;

the light scattering film comprising the light scattering particles;

the color resist layer comprising the color resist material;

the light scattering film being positioned between the color resist layer and the color filter substrate.

In one of the embodiments, the light scattering film further comprises a transparent polymer comprising at least one of polymethyl methacrylate resin and polystyrene resin.

In one of the embodiments, the color resist material and the light scattering particles are mixed with each other in the color filter layer.

In one of the embodiments, the light scattering particles comprise at least one of titanium dioxide particles, magnesium dioxide particles, and zirconium dioxide particles.

In one of the embodiments, the color filter substrate is a rigid substrate or a flexible substrate.

In one of the embodiments, the color filter substrate is a glass substrate.

In one of the embodiments, the black matrices are organic photoresist black matrices, and a plurality of grooves are formed between the plurality of black matrices and the color filter substrate.

the present disclosure also provides a method for preparing the color filter base plate.

The technical solution is as follows:

A method for preparing the color filter base plate comprises the following steps of:

manufacturing a plurality of black matrices on a color filter substrate; and forming a color filter layer between two adjacent black matrices, wherein the color filter layer comprises a color resist material and light scattering particles.

In one of the embodiments, the step of forming the color filter layer between two adjacent black matrices comprises:

forming a light scattering film between two adjacent black matrices, the light scattering film comprising the light scattering particles; and depositing the color resist material on the light scattering film to form a color resist layer.

In one of the embodiments, the light scattering film is made of a raw material comprising the light scattering particles and the transparent polymer; the transparent polymer comprising at least one of polymethyl methacrylate resin and polystyrene resin.

In one of the embodiments, the step of forming the color filter layer between two adjacent black matrices comprises:

dispersing the light scattering particles in the color resist material to obtain a mixed material; and depositing the mixed material between two adjacent black matrices to form a color filter layer.

In one of the embodiments, the light scattering particles are at least one selected from titanium dioxide particles, magnesium dioxide particles, and zirconium dioxide particles.

The present disclosure also provides a display device.

The technical solution is as follows:

A display device comprises:

a display base plate;

an packing structure disposed on the display base plate; and the above-mentioned color filter base plate, the plurality of black matrices, and the color filter layer being disposed between the packaging structure and the color filter substrate.

In one of the embodiments, the color filter layer comprises a light scattering film and a color resist layer that are stacked;

the light scattering film comprising the light scattering particles;

the color resist layer comprising the color resist material;

the light scattering film being positioned between the color resist layer and the color filter substrate.

In one of the embodiments, the color resist material and the light scattering particles are mixed with each other in the color filter layer.

In one of the embodiments, the display base plate comprises a TFT driving array base plate and an OLED light emitting unit;

the OLED light emitting unit being disposed on the TFT driving array base plate.

In one of the embodiments, the OLED light emitting unit comprises an R light emitting unit, a G light emitting unit, and a B light emitting unit.

In one of the embodiments, the packaging structure is disposed on the TFT driving array base plate to pack the OLED light emitting unit.

In one of the embodiments, the packaging structure comprises a packaging layer, the packaging layer being disposed on the OLED light emitting unit and comprising an oxide layer and an organic layer that are stacked, the oxide layer being disposed between the organic layer and the OLED light emitting unit. The oxide layer and the organic layer are formed by deposited oxides and organics, respectively.

Compared with the prior art, the present disclosure has the following beneficial effects:

The black matrices and the color filter layer are disposed on the color filter substrate of the color filter base plate of the present disclosure, wherein the color filter layer is made of a raw material containing the color resist material and the light scattering particles. When the light source passes through the light scattering particles, the scattering of the light is increased, thus achieving an increased viewing angle of the display devices. Meanwhile, the color filter layer containing the color resist material and the light scattering particles is positioned between the two adjacent black matrices and has a fixed boundary, no color mixing occurs on the boundary of pixels of adjacent color, which is beneficial to the clear display of the displayed image. Moreover, the color resist material has an anti-reflection effect, which can further improve the display effect of the display devices.

DETAILED DESCRIPTION OF THE EMBODIMENTS

Figure 1:
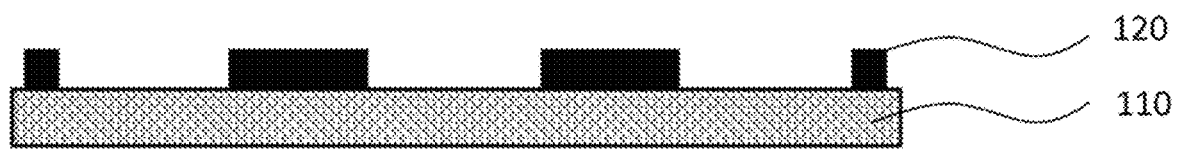
FIGS. 1 to 3 are schematic diagrams of a preparation process of a color filter base plate of an embodiment of the present disclosure.

A color filter base plate and a method for preparing the same, and a display device and a method for preparing the same of the present disclosure are further described in detail in conjunction with the specific embodiments. The present disclosure may be embodied in many different forms and not limited to the embodiments set forth herein. Rather, these embodiments are provided so that the present disclosure is more thorough and comprehensive to understand.

Unless defined otherwise, all technical and scientific terms used herein have the same meaning as commonly understood by those skilled in the art to which the present disclosure belongs. Herein, the terms used in the specification of the present disclosure is only for the purpose of describing specific embodiments, but not intended to be limiting of the present disclosure. The term "and/or" as used herein comprises all combinations of one or more of the related listed items.

An embodiment of the present disclosure provides a color filter base plate, comprising a color filter substrate, a plurality of black matrices positioned on the color filter substrate, and a color filter layer; the color filter layer being disposed between two adjacent black matrices.

The color filter layer comprises a color resist material and light scattering particles.

Specifically, the color filter substrate is configured to support the color filter layer and the black matrices. The color filter substrate may be a rigid substrate or a flexible substrate, and the rigid substrate may be selected from a glass substrate.

The black matrix is positioned on the color filter substrate. The black matrices (BM) are made of a BM organic photoresist material, and the black matrix may be formed by patterning through a photolithography process. It should be understood that the preparation process of the black matrix may be as follow: the BM organic photoresist material is deposited on the color filter substrate, and then a layer of photoresist is coated. The photoresist is exposed through a mask ciplate and developed to form an unexposed area and a fully exposed area, and then all the photoresist in the fully exposed area is removed, thus obtaining a plurality of black matrices.

The black matrix is configured to block light and prevent light leakage. The mutually spaced black matrices and the color filter substrate form a plurality of grooves corresponding to light sources, and the color filter layer is positioned between two adjacent black matrices, that is, the color filter layer is deposited in the above-mentioned grooves, that is, the color filter layer corresponds to the light sources.

The color filter layer is made of a raw material comprising a color resist material and light scattering particles. The light scattering particles may be selected from one of inorganic nanoparticles such as titanium dioxide, magnesium dioxide, or zirconium dioxide. Alternatively, the light scattering particles may also be a mixture of any two inorganic nanoparticles of titanium dioxide, magnesium dioxide, and zirconium dioxide, or the light scattering particles may also be a mixture of three inorganic nanoparticles of titanium dioxide, magnesium dioxide, and zirconium dioxide. The color filter layer may have different colors, such as red, green, or blue. The color resist material in the color filter layer of a certain color enables the light of that color to pass therethrough, and filters or absorbs the light of the other two colors.

In an embodiment, the color filter layer comprises a light scattering film and a color resist layer that are stacked. The light scattering film is made of a raw material comprising the light scattering particles, and the color resist layer is made of the color resist material.

Specifically, the material of the color resist layer comprises a color resist material of a desired color, and the color resist layer may be formed by patterning through a photolithography process. The light scattering film comprises the light scattering particles, and may further comprise a transparent polymer. The light scattering film may also be formed by patterning through a photolithography process. The transparent polymer comprises, but is not limited to, PMMA resin, PS resin, or a combination of PMMA resin and PS resin. The PMMA resin is polymethyl methacrylate resin; and the PS resin is polystyrene resin.

In an embodiment, the light scattering film is positioned between the color resist layer and the color filter substrate, that is, the light scattering film is firstly formed, and then the color resist layer is formed. According to this structure, when the above-mentioned color filter base plate is used in a display device, the light source firstly passes through the light scattering film and then through the color resist layer. The boundary of the pixel is determined by the color resist layer, thus the color mixing phenomenon on the pixel edge will not occur.

In another embodiment, the color filter layer is made of a mixed material consisting of the color resist material of the desired color and the light scattering particles, and comprises the color resist material of the desired color and the light scattering particles mixed with each other. The specific preparation method is as follows: the light scattering particles are firstly dispersed in the color resist material to obtain the mixed material, then the mixed material is deposited between two adjacent black matrices, and it is obtained by patterning through a photolithography process.

When the light source passes through the color filter base plate with the color filter layer described in an embodiment of the present disclosure, through the light scattering particles, scattering of the light is increased, thus achieving an increased viewing angle of the display devices. The color filter layer containing the color resist material and the light scattering particles is positioned between the several black matrices and has a fixed boundary, no color mixing occurs on the boundary of pixels of adjacent color, which is beneficial to the clear display of the displayed image. In an embodiment, the color resist material has an anti-reflection effect, which can further improve the display effect of the display devices.

An embodiment of the present disclosure also provides a display device, comprising:
 a display base plate;
 a packaging structure disposed on the display base plate; and
 the above-mentioned color filter base plate disposed on the packaging structure.

Specifically, the display base plate comprises a TFT driving array base plate and an OLED light emitting unit. The OLED light emitting unit is disposed on the TFT driving array base plate. The packaging structure is configured to pack the OLED light emitting unit. A plurality of color filter layers of the color filter base plate are in one-to-one correspondence with a plurality of OLED light emitting units, such that the light emitted by each OLED light emitting unit can exit after passing through the corresponding color filter layer. A surface of the color filter base plate away from the color filter substrate is disposed on a side adjacent to the packaging structure, that is, the black matrices and the color filter layer in the color filter base plate are disposed between the packaging structure and the color filter substrate.

An embodiment of the present disclosure also provides a method for preparing the display device, which comprises the following steps of:
 manufacturing a packaging structure on a display base plate;
 manufacturing a color filter base plate using the above-mentioned method; and
 pairing a surface of the color filter base plate away from the color filter substrate with the packaging structure on the display base plate to obtain the display device.

Specifically, the display base plate is formed by evaporating or printing an OLED light emitting unit on a base plate with a TFT array. The OLED light emitting unit comprises a red (R) light emitting unit, a green (G) light emitting unit, and a blue (B) light emitting unit. Further, the R light emitting unit, G light emitting unit, and B light emitting unit in the OLED light emitting unit respectively correspond to one color filter layer comprising the color resist material of corresponding colors and the light scattering particles. After the light source passes through the color filter layer, the light of different colors of R. G. or B can be emitted. More specifically, the color resist material of the color filter layer of a certain color enables the light of that color to pass therethrough, and absorb or block the light of the other two colors, so that the white light presents R. G. or B color light after passing through the color filter layer of the corresponding color. After each light emitting unit emits light, the light scattering particles in the color filter layer can firstly receive the light to increase the scattering of the light, thus achieving the purpose of increasing the viewing angle of the display device. After the light scattered by the light scattering particles passes through the color resist layer with a fixed boundary, no color mixing occurs on the boundary of pixels of adjacent color, which is beneficial to the clear display of the displayed image.

In the packaging structure, oxides and organics can be deposited on the OLED light emitting unit by thin film packing such as CVD/ALD, printing, and the like, so that the oxides and organics are stacked to form the packaging layer.

It should be understood that, before pairing the display base plate having the packaging structure with color filter base plate, frame glue is applied to the two surfaces to be paired, and after the two surfaces with the frame glue are paired, the manufacturing of the display device is completed by baking.

Example 1

This example provided a color filter base plate and a display device, and the specific preparation method was as follows:

S11. A BM organic photoresist material was deposited on a color filter substrate 110, and a plurality of mutually spaced black matrices 120 were formed by patterning through a photolithography process. As shown in FIG. 1, a plurality of grooves were formed between the plurality of black matrices 120 and the color filter substrate 110.

Figure 2:
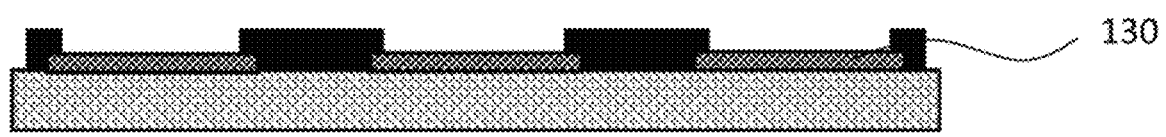
Figure 3:
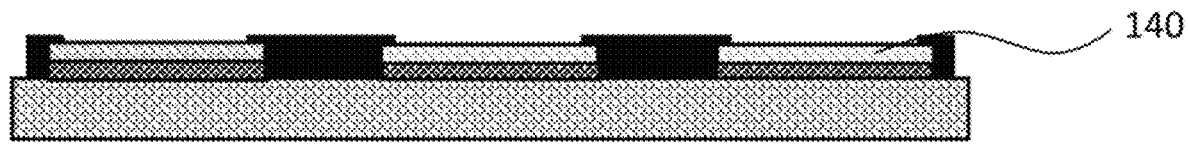

S12. A light scattering material formed by mixing titanium dioxide particles and a transparent polymer was deposited between two adjacent black matrices 120, and a light scattering film 130 was formed by patterning through a photolithography process, as shown in FIG. 2. The transparent polymer comprised polymethyl methacrylate (PMMA) resin and polystyrene (PS) resin. S13. A color resist material was coated on the above-mentioned light scattering film 130, and a color resist layer 140 was formed by patterning through a photolithography process to obtain a color filter layer comprising the light scattering film 130 and the color resist layer 140, that is, the color filter base plate, as shown in FIG. 3.

Figure 4:
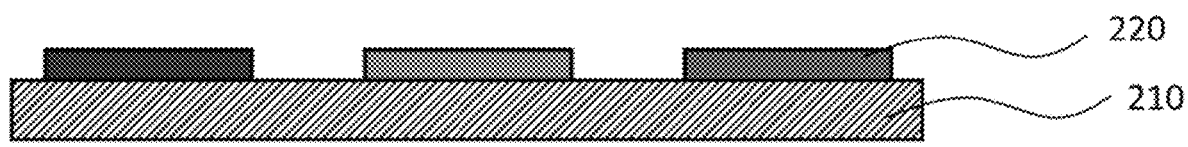
FIG. 4 is a schematic structural diagram of a display base plate of an embodiment of the present disclosure.

S14. An OLED light emitting unit 220 was deposited on a base plate 210 containing TFT driving array to obtain a display base plate, as shown in FIG. 4.

Figure 5:
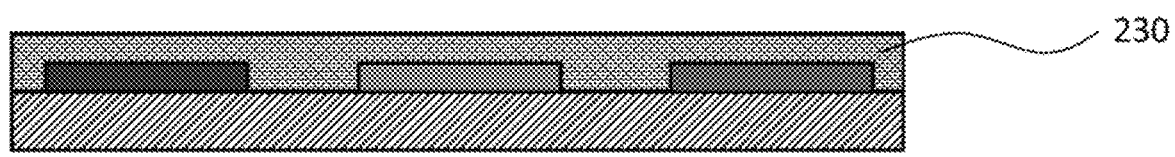
FIG. 5 is a schematic structural diagram of a display base plate provided with a packaging structure of an embodiment of the present disclosure.

S15. The OLED light emitting unit 220 was packed to obtain a display base plate provided with a packaging structure 230, as shown in FIG. 5.

Figure 6:
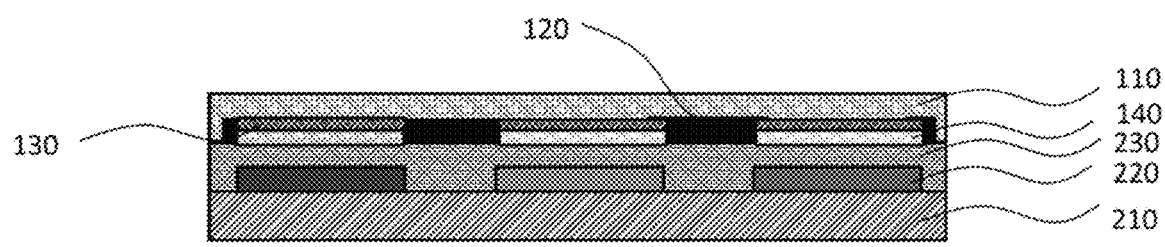
FIG. 6 is a schematic structural diagram of a display device of an embodiment of the present disclosure.

S16. The surface of the color filter base plate away from the color filter substrate 110 in FIG. 3 was paired with the packaging structure 230 on the display base plate in FIG. 5 to obtain the display device as shown in FIG. 6.

Example 2

This example provided a color filter base plate and a display device, and the specific preparation method was as follows:

S21. A BM organic photoresist material was deposited on a color filter substrate 110, and a plurality of black matrices 120 were formed by patterning through a photolithography process. As shown in FIG. 1, a plurality of grooves were formed between the plurality of black matrices 120 and the color filter substrate 110.

Figure 7:
FIG. 7 is a schematic structural diagram of a color filter base plate of another embodiment of the present disclosure.

S22. Titanium dioxide particles were dispersed in the color resist material to obtain a mixed material, the mixed material was coated between two adjacent black matrices 120, and a color filter layer 150 was formed by patterning through a photolithography process to obtain the color filter base plate, as shown in FIG. 7.

S23. A OLED light emitting unit 220 was deposited on a base plate 210 containing TFT driving array to obtain a display base plate, as shown in FIG. 4.

S24. The OLED light emitting unit 220 was packed to obtain a display base plate provided with a packaging structure 230, as shown in FIG. 5.

Figure 8:
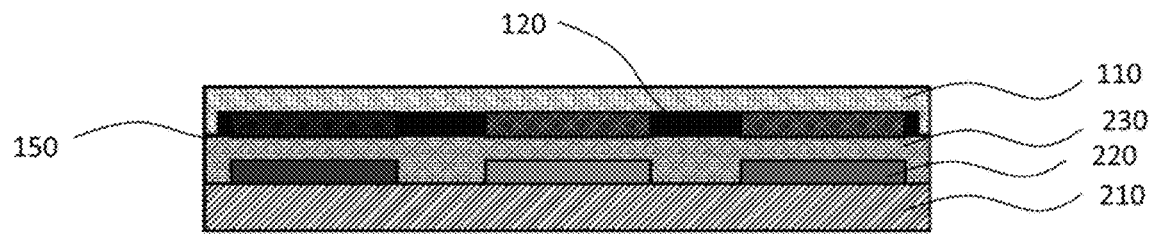
FIG. 8 is a schematic structural diagram of a display device of another embodiment of the present disclosure.

S25. The surface of the color filter base plate away from the color filter substrate 110 in FIG. 7 was paired with the packaging structure 230 on the display base plate in FIG. 5 to obtain the display device as shown in FIG. 8.

Comparative Example

This comparative example provided a color filter base plate and a display device, and the specific preparation method was as follows:

S31. A BM organic photoresist material was deposited on a color filter substrate 110, and a plurality of black matrices 120 were formed by patterning through a photolithography process. As shown in FIG. 1, a plurality of grooves were formed between the plurality of black matrices 120 and the color filter substrate 110.

S32. A color resist material was coated between two adjacent black matrices 120, and a color resist layer 140 was formed by patterning through a photolithography process to obtain the color filter base plate.

S33. An OLED light emitting unit 220 was deposited on a base plate 210 containing TFT driving array to obtain a display base plate, as shown in FIG. 4.

S34. The OLED light emitting unit 220 was packed to obtain a display base plate provided with a packaging structure 230, as shown in FIG. 5.

Figure 9:
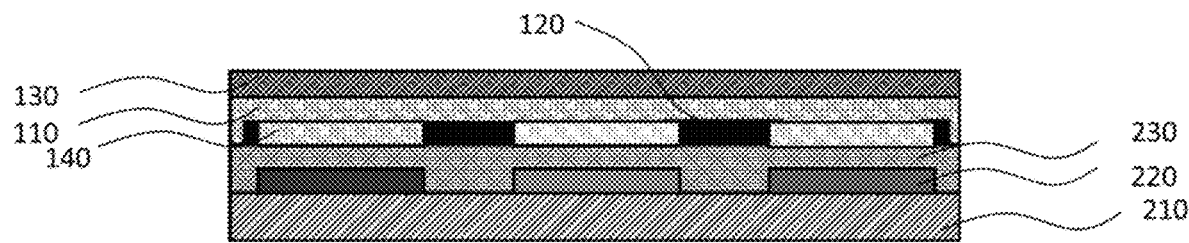
FIG. 9 is a schematic structural diagram of a display device of a comparative example of the present disclosure.

S35. The surface of the color filter base plate away from the color filter substrate 110 in S32 was paired with the packaging structure 230 on the display base plate in FIG. 5, and a light scattering material made of a mixture of titanium dioxide particles and PMMA was deposited on another surface of the color filter substrate 110 to form a light scattering film 130, thereby obtaining a display device as shown in FIG. 9.

In the display devices of Example 1 and Example 2, when the light source passes through the light scattering particles, the scattering of the light is increased, thus achieving an increased viewing angle of the display devices. Meanwhile, after the light scattered by the light scattering particles passes through the color filter layer with a fixed boundary, no color mixing occurs on the boundary of pixels of adjacent color, which is beneficial to the clear display of the displayed image.

In the display device of the comparative example, the light scattered by the light scattering particles was more scattered, and color mixing was likely to occur at the boundaries of sub-pixels of adjacent color. As the resolution of the display panel increases, the color mixing becomes more serious, and as the thinness of scattering film increases, the color mixing also becomes more serious, i.e., the displayed image becomes less clear. These phenomena indicates that the position of the light scattering particles has a greater impact on the display effect of the display devices.

The technical features of the above-mentioned embodiments can be combined arbitrarily. In order to make the description concise, all possible combinations of the various technical features in the above-mentioned embodiments may not be described. However, these combinations of technical features should be considered as within the scope of this specification, as long as there is no contradiction between them.

The above-mentioned examples only express several embodiments of the present disclosure with more specific and detailed descriptions, but should not be understood as a limitation to the scope of the present disclosure. It should be pointed out that for those of ordinary skill in the art, several modifications and improvements can be made without departing from the concept of the present disclosure, and these all fall within the protection scope of the present disclosure. Therefore, the scope of protection of the present disclosure shall be subject to the appended claims.

What is claimed is:

1. A color filter base plate, comprising:
a color filter substrate;
a plurality of black matrices positioned on the color filter substrate; and
a color filter layer;
wherein the color filter layer is disposed between two adjacent black matrices; wherein the color filter layer includes a color resist material and light scattering particles;
wherein the color filter layer comprises a light scattering film and a color resist layer that are stacked; and
wherein the light scattering film is positioned between the color resist layer and the color filter substrate.

2. The color filter base plate according to claim 1, wherein;
the light scattering film comprising the light scattering particles; and
the color resist layer comprising the color resist material.

3. The color filter base plate according to claim 2, wherein the light scattering film further comprises a transparent polymer; wherein the transparent polymer comprising at least one of polymethyl methacrylate resin and polystyrene resin.

4. The color filter base plate according to claim 1, wherein the color resist material and the light scattering particles are mixed with each other in the color filter layer.

5. The color filter base plate according to claim 1, wherein the light scattering particles comprise at least one of titanium dioxide particles, magnesium dioxide particles, or zirconium dioxide particles.

6. The color filter base plate according to claim 1, wherein the color filter substrate is a rigid substrate or a flexible substrate.

7. The color filter base plate according to claim 1, wherein the color filter substrate includes a glass substrate.

8. The color filter base plate according to claim 1, wherein the black matrices are organic photoresist black matrices, and a plurality of grooves are formed between the plurality of black matrices and the color filter substrate.

9. A method for preparing a color filter base plate, the method comprising:
    manufacturing a plurality of black matrices on a color filter substrate; and
    forming a color filter layer between two adjacent black matrices, wherein the color filter layer comprises a color resist material and light scattering particles;
    wherein the step of forming the color filter layer between two adjacent black matrices comprises:
        forming a light scattering film between two adjacent black matrices, the light scattering film comprising the light scattering particles; and
        depositing the color resist material on the light scattering film to form a color resist layer.

10. The method for preparing the color filter base plate according to claim 9, wherein the light scattering film further comprises a transparent polymer comprising at least one of polymethyl methacrylate resin and polystyrene resin.

11. The method for preparing the color filter base plate according to claim 9, wherein forming the color filter layer between two adjacent black matrices comprises:
    dispersing the light scattering particles in the color resist material to obtain a mixed material; and
    depositing the mixed material between two adjacent black matrices to form the color filter layer.

12. The method for preparing the color filter base plate according to claim 9, wherein the light scattering particles are selected from at least one of titanium dioxide particles, magnesium dioxide particles, or zirconium dioxide particles.

13. A display device, comprising:
    a display base plate;
    a packaging structure disposed on the display base plate; and
    the color filter base plate according to claim 1, the plurality of black matrices and the color filter layer being disposed between the packaging structure and the color filter substrate;
    wherein the color filter layer comprises a light scattering film and a color resist layer that are stacked; and
    wherein the light scattering film is positioned between the color resist layer and the color filter substrate.

14. The display device according to claim 13, wherein;
    the light scattering film comprising the light scattering particles; and
    the color resist layer comprising the color resist material.

15. The display device according to claim 13, wherein the color resist material and the light scattering particles are mixed with each other in the color filter layer.

16. The display device according to claim 13, wherein the display base plate comprises a TFT driving array base plate and an OLED light emitting unit;
    the OLED light emitting unit being disposed on the TFT driving array base plate.

17. The display device according to claim 16, wherein the OLED light emitting unit comprises an R light emitting unit, a G light emitting unit, and a B light emitting unit.

18. The display device according to claim 14, wherein the packaging structure is disposed on the TFT driving array base plate to package the OLED light emitting unit.

19. The display device according to claim 18, wherein the packaging structure comprises a packaging layer, the packaging layer being disposed on the OLED light emitting unit and comprising an oxide layer and an organic layer that are stacked, the oxide layer being disposed between the organic layer and the OLED light emitting unit.

* * * * *